United States Patent

[11] 3,602,778

[72] Inventors Mitsuru Ura;
Takuzo Ogawa, both of Hitachi-shi, Japan

[21] Appl. No. 762,018
[22] Filed Sept. 24, 1968
[45] Patented Aug. 31, 1971
[73] Assignee Hitachi, Ltd.
Tokyo-To, Japan
[32] Priority Sept. 25, 1967, Sept. 27, 1967, Sept. 27, 1967
[33] Japan
[31] 42/61252, 42/61728 and 42/61730

[54] ZENER DIODE AND METHOD OF MAKING THE SAME
19 Claims, 16 Drawing Figs.

[52] U.S. Cl. 317/234 R, 148/1.5, 148/175, 317/235 T, 317/234 Q, 317/235 AM
[51] Int. Cl. H01l 9/00
[50] Field of Search 317/234, 235; 148/1.5, 33, 33.1, 174, 175

[56] References Cited
OTHER REFERENCES
" Design and Fabrication of Germanium Tunnel Diodes" by N. H. Ditrick & H. Nelson published " R.C.A. Engineer Vol. 6 No. 2 Aug.– Sept. 1960

*Primary Examiner*—Jerry D. Craig
*Attorney*—Craig, Antonelli & Hill

ABSTRACT: A Zener diode having a low dynamic impedance and a low leakage current which comprises a first layer of a single crystalline semiconductor of silicon doped with a P-type or N-type impurity and a second layer formed by gas-phase epitaxial growth of silicon and doped with an impurity of the opposite type. In the Zener diode, the impurity concentrations of the first and second layers are $1\times10^{17}$ to $4\times10^{19}$ atoms/cm.$^3$ and $1\times10^{19}$ to $1\times10^{21}$ atoms/cm.$^3$, respectively, and there is an impurity concentration gradient of from $2\times10^{21}$ to $7\times10^{23}$ atoms/cm.$^4$ across the PN junction.

INVENTORS

MITSURU URA

TAKUZO OGAWA

BY Craig & Antonelli

ATTORNEYS

INVENTORS

MITSURU URA

TAKUZO OGAWA

BY Craig & Antonelli

ATTORNEYS

INVENTORS
MITSURU URA
TAKUZO OGAWA

BY Craig & Antonelli
ATTORNEYS

INVENTORS
MITSURU URA
TAKUZO OGAWA
BY Craig & Antonelli
ATTORNEYS

INVENTORS
MITSURU URA
TAKUZO OGAWA

BY Craig & Antonelli
ATTORNEYS

INVENTORS
MITSURU URA
TAKUZO OGAWA
BY Craig & Antonelli
ATTORNEYS

ZENER DIODE AND METHOD OF MAKING THE SAME

This invention relates to a Zener diode and a method of making the same. Hitherto, an alloying method or diffusion method has been employed to obtain a PN junction in a Zener diode. Alloying method is employed to produce low breakdown Zener diodes and diffusion method is employed to produce high breakdown Zener diodes. While it has been possible according to the alloying method to obtain a PN junction having a substantially stepwise impurity concentration gradient, it has been difficult to make a Zener diode which has a large current capacity requiring a wide junction area because of the fact that stress or cracks are liable to occur in the vicinity of the junction due to the difference between the thermal expansion coefficient of a semiconductor material and that of an alloyed region. While the diffusion method has been advantageous in that it does not involve the defects encountered with the alloying method, it has not been possible to make a Zener diode having a breakdown voltage of less than about 20 volts therewith because of the difficulty of providing a substantially stepwise impurity concentration gradient across the junction. Furthermore, the junction surface formed by the alloying method is not flat, and local defects in its junction is produced. As a result, the junction is subjected to breakdown, current distribution at the junction is not uniform and leakage current of the junction becomes large. According to the diffusion method, it is difficult to obtain a flat PN junction interface because there are microcrystal imperfections and slight fluctuations of impurity distribution so that local breakdown takes place in the PN junction. As a result, current stability is reduced and leakage current will be increased. Therefore, these Zener diodes do not have desirable breakdown characteristics. This is especially true when a diffusion method is used since a sufficient impurity concentration gradient is difficult to attain and the plane of the PN junction cannot be made satisfactorily flat, resulting in an enlarged depth of the space charge layer. Consequently, an increased dynamic impedance is created and the diode cannot exhibit satisfactory constant voltage characteristics. Thus, the current capacity and breakdown characteristics of Zener diodes made by the prior art methods have been quite limited and it has been difficult with these methods to make Zener diodes completely satisfying the desired specifications, for example, less than 10 volts of Zener breakdown and more than 10 watts of power capacity.

In an effort to overcome the above problems, the inventors have made a series of experiments and studies and discovered that a high-doped region in the PN junction which has desirable breakdown characteristics should be formed only by the epitaxial growth process. In view of the fact that Zener diodes produced by the epitaxial growth process have not yet been made public although the epitaxial growth process itself is widely known in the art, it seems that the breakdown characteristics of the PN junction formed by the epitaxial growth process have not yet been fully clarified.

It is an object of the present invention to provide a novel technique utilizing the epitaxial growth for the manufacture of a Zener diode having the desired breakdown characteristics at a high yield rate.

Another object of the present invention is to provide a Zener diode which has a very small leakage current and dynamic impedance across the PN junction and which has excellent breakdown characteristics.

A further object of the present invention is to provide a Zener diode whose junction area can be widened without giving rise to any physical as well as electrical trouble throughout the period of manufacture and operation.

A still further object of the present invention is to provide a Zener diode which has a large current capacity and a low breakdown voltage.

Another object of the present invention is to provide a Zener diode to which a metal conductor can be bonded without in any way varying or deteriorating the electrical properties of the PN junction. Still another object of the present invention is to provide an epitaxial growth process which is reasonably employed for the attainment of the above objects.

The above and other objects, features and advantages of the present invention will be apparent from the following description, taken in conjunction with the accompanying drawings.

Making use of the epitaxial growth process, the inventors have made a number of Zener diodes and measured the breakdown characteristics thereof in an attempt to search for the best conditions and method for making a Zener diode having the desired characteristics. As a result, for a base layer of a PN junction the inventors have found that such a Zener diode must have a specific impurity concentration which differs from those employed heretofore in making Zener diodes according to the known alloying method and diffusion method, and for junction properties, the impurity concentration gradient differs from that of the conventional Zener diode.

The many objects and advantages of the present invention are realized by forming at least a high-doped region of a PN junction comprising high-doped and low-doped regions in accordance with epitaxial growth, determining the impurity concentrations of the high-doped region and the low-doped region adjacent thereto on the basis of desired breakdown characteristics, and specifically limiting the impurity concentration gradient across the PN junction so that its value lies within a range which will be described in detail later.

In the drawings:

FIGS. 1*a*, 1*b* and 1*c* are schematic sectional views for the purpose of illustrating the Zener diode according to the present invention;

FIG. 2 is a graph showing the backward current-voltage characteristics of the Zener diode which is made utilizing the process of epitaxial growth;

FIGS. 3*a* and 3*b* are schematic illustrations of different production processes for making the Zener diode according to the present invention;

Figure 7A:
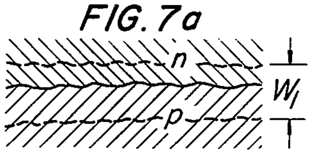
Figure 7B:
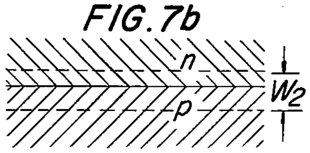
Figure 8A:
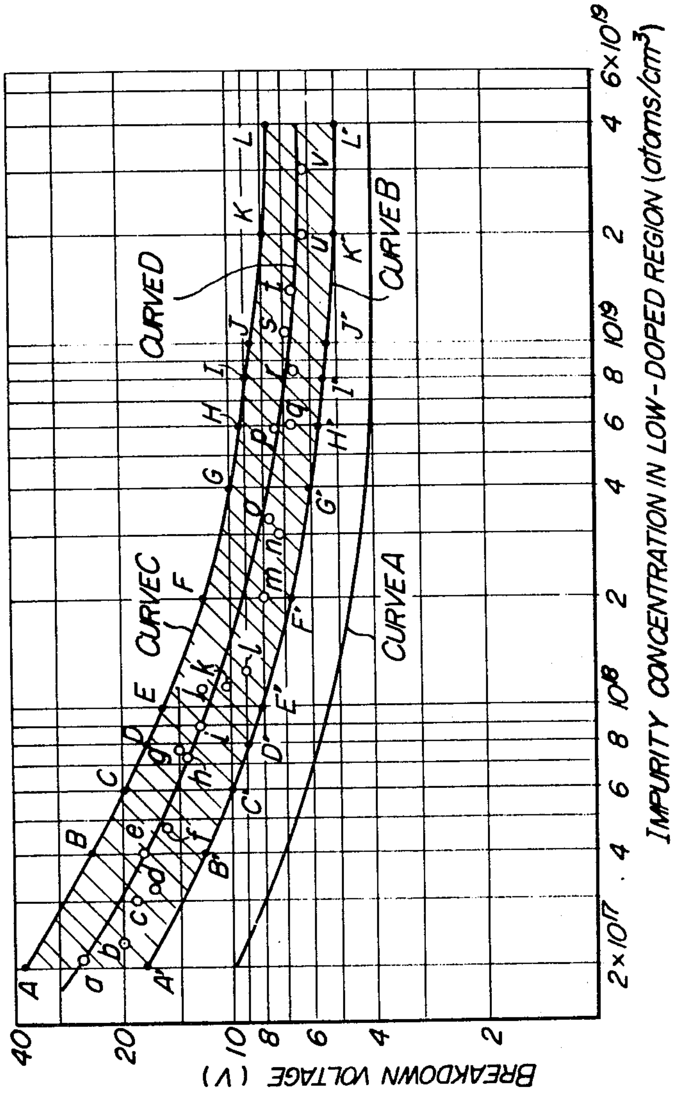
Figure 8B:
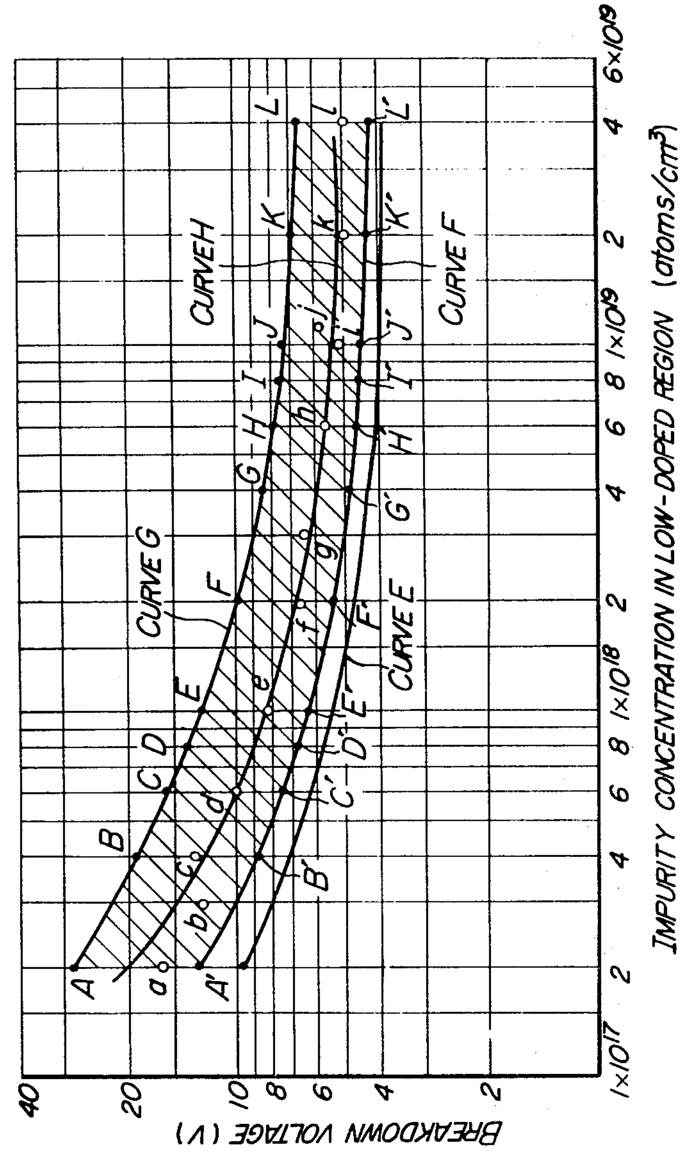
Figure 9A:
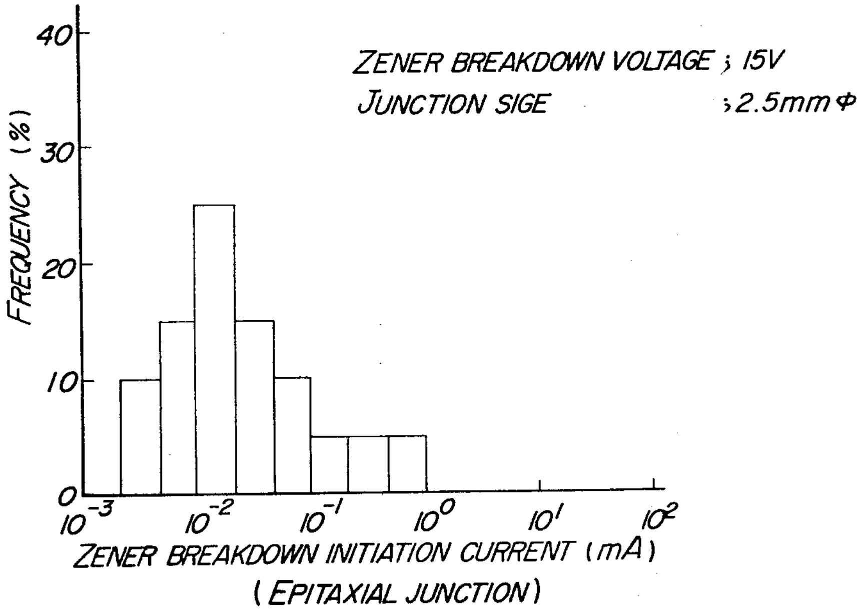
Figure 9B:
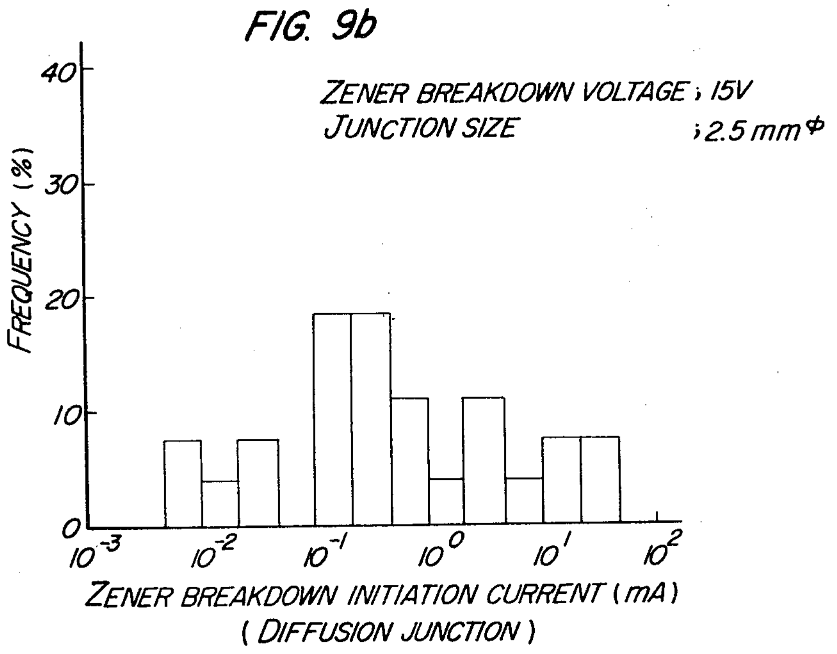
Figure 10:
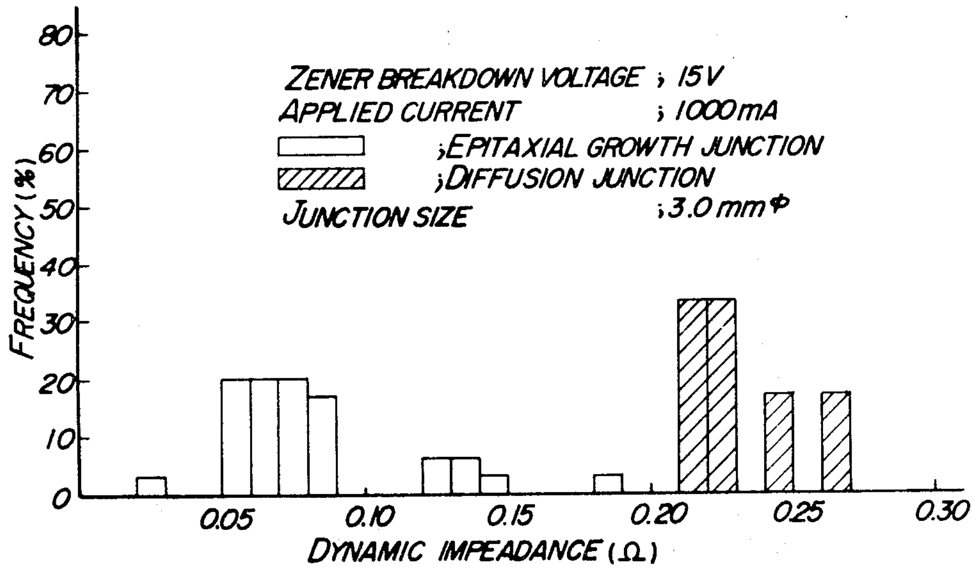

FIGS. 7*a* and 7*b* are explanatory views illustrating the space charge layer in the PN junctions made by diffusion and by epitaxial growth, respectively;

FIGS. 8*a* and 8*b* are graphs showing the impurity concentration of the low-doped region of the Zener diode according to the present invention relative to Zener breakdown voltage;

FIGS. 9*a* and 9*b* are graphs showing frequencies of the Zener breakdown initiation current measured on the PN junction of Zener diodes made according to the present invention and of a similar current measured on the PN junction of conventional Zener diodes made by diffusion, respectively; and FIG. 10 is a graph showing frequencies of the dynamic impedance in Zener diodes made according to the present invention compared with a similar impedance distribution in conventional Zener diodes made by diffusion.

In accordance with the present invention, there must be a predetermined impurity concentration gradient across the PN junction so as to obtain low Zener breakdown voltage diodes, especially those having a breakdown voltage lower than 20 volts. The Zener diode according to the present invention comprises a high-doped region which is formed by means of epitaxial growth, and the high-doped region is required to have an impurity concentration of $1\times10^{19}$ to $1\times10^{21}$ atoms/cm.$^3$. In case the impurity concentration of the high-doped region of, for example, N-type is less than $1\times10^{19}$ atoms/cm.$^3$, undesirable inversion of the conductivity type of the alloyed region into P-type may take place when aluminum is alloyed to the high-doped region for ohmic contact therewith. The solid solubility of aluminum with respect to silicon is about $6\times10^{18}$ atoms/cm.$^3$ at 600° C., about $1\times10^{19}$ atoms/cm.$^3$ at 700°C., about $1\times10^{19}$ atoms/cm.$^3$ at 800° C., about $1.5\times10^{19}$ atoms/cm.$^3$ at 900° C., about $1.8\times10^{19}$ atoms/cm.$^3$ at 1,000° C., and about $2\times10^{19}$ atoms/cm.$^3$ at 1,100° C. Since the alloying of aluminum is commonly done at a temperature of 650 to 800° C., especially, at a temperature in the vicinity of 740±20° C., it is necessary that the high-doped N-type region have an impurity concentration of more than $1\times10^{19}$ atoms/cm.$^3$. On the other hand, an impurity concentration of more than $1\times10^{21}$ atoms/cm.$^3$ in the deposited silicon layer is difficult to obtain with epitaxial growth because the deposited silicon layer becomes polycrystalline.

The impurity concentration of the low-doped region determines the Zener breakdown characteristics, especially the Zener breakdown voltage of the diode, and is selected to lie within a range between $1\times10^{17}$ atoms/cm.$^3$ and $4\times10^{19}$ atoms/cm.$^3$ so that the impurity concentration gradient across the PN junction which is determined by heating temperature and heating time during the epitaxial growth of the high-doped region has a value which lies between $2\times10^{21}$ atoms/cm.$^4$ and $7\times10^{23}$ atoms/cm.$^4$. The low-doped region may be a single crystalline silicon which contains an impurity within the above-specified range and may be a conventional pulled single crystal or a floating zone single crystal wafer, or which is formed on a single crystalline silicon by means of epitaxial growth. The epitaxial growth process is especially suitable for obtaining a Zener diode having a large junction area, hence a large current capacity, since the impurity distribution of deposited silicon can be made uniform throughout the deposited silicon layer, and as a result thereof the breakdown characteristics of the wafer are made uniform in any portion. In other words, Zener diodes having desired electrical characteristics can be produced with a high yield rate.

Figure 6:
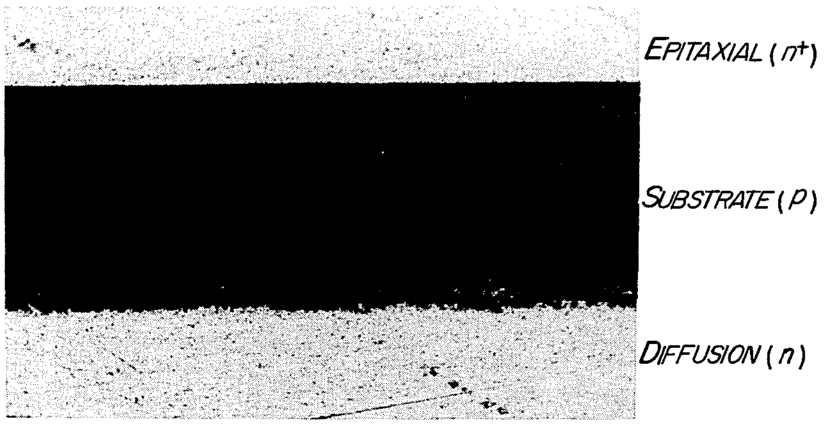
FIG. 6 is a microscopic photograph showing the interface state of two PN junctions made by epitaxial growth and by diffusion.

As described already, the PN junction in the Zener diode according to the present invention must have an impurity concentration gradient of $2\times10^{21}$ to $7\times10^{23}$ atoms/cm.$^4$ thereacross. To this end, its high-doped region must be formed by means of epitaxial growth. Furthermore, the Zener characteristics of the diode may be impaired unless the junction is sufficiently flat. As seen in FIG. 6 showing the interface states on the epitaxial and diffused junction, the uniformities thereof are sufficiently different from each other, that is, the plane of a PN junction becomes flat when an $N^+$-type region is formed by epitaxial growth on a flat and smooth surface of a P-type substrate. FIGS. 7*a* and 7*b* show explanatory models of space charge layers where a backward voltage is applied to the PN junction formed by the diffusion method and epitaxial growth method respectively. As seen in FIG. 7*b*, the space charge layer in such a PN junction has a small depth $W_2$. In contrast, the plane of a PN junction formed by diffusion is not flat as seen in FIG. 6, and the space charge layer in such a PN junction has a depth $W_1$ which is apparently larger than the depth $W_2$ as seen in FIG. 7*a*. If the Zener a, voltages of the inventive Zener diode and of the conventional Zener diode by a diffusion method are the same, the impurity distribution in the PN junction thereof and the width of space charge layer are different from each other, that is, the latter has a larger width than that of the former. As a result, diodes according to the diffusion method have a large dynamic impedance compared with the inventive diodes. Moreover, the nonflatness of the PN junction interface obtained by means of diffusion suffers from local breakdown so that the Zener breakdown characteristics thereof are inferior. It will be understood from the above discussion that the high-doped region must be formed by epitaxial growth.

Figure 3A:
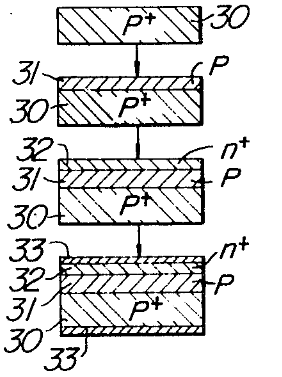
Figure 3B:
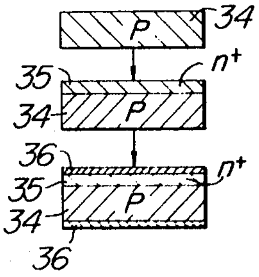

As shown in FIGS. 3*a* and 3*b*, a single crystalline silicon is employed as a substrate and a desired semiconductor is caused to deposit on the substrate by epitaxial growth. In FIG. 3*a*, a $P^+$-type silicon 30 is employed as a substrate, and a low-doped region 31 is formed on the substrate 30 by epitaxial growth. Then, a high-doped region 32 of $N^+$-type is epitaxially grown on the low-doped region 31 to obtain a PN junction. After the silicon wafer having the PN junction is thus made, a suitable metal conductor 33 is provided on each of the opposite surfaces of the wafer. Nickel plating or nickel-gold plating is a suitable conductor because it makes soldering easy, but a metal material such as aluminum or gold-antimony may be employed as electrodes. In FIG. 3*b*, a silicon crystal wafer 34 which serves as a low-doped region is employed as a substrate and a high-doped region 35 is formed thereon by epitaxial growth. A pair of metal conductors 36 are also provided in the same manner as in FIG. 3*a*.

The Zener diode according to the present invention is featured by forming the high-doped region by means of epitaxial growth, and it will therefore be apparent that the manner of preparation of the low-doped region is in no way limited to those illustrated in FIGS. 3*a* and 3b. For example, a $P^+$-type region may be formed on a P-type substrate by diffusion. This $P^+$-type region is not what is called the high-doped region in the present invention insofar as the Zener diode has an $N^+PP^+$ structure. Similarly, an $N^+$-type region in an $N^+NP^+$ structure is not the so-called high-doped region in the present invention. It is to be understood that one of the two regions constituting a PN junction is called the high-doped region and the other is called the low-doped region in accordance with the present invention.

The starting material preferably employed in the epitaxial growth process according to the present invention is a compound of silicon such as monosilane $SiH_4$, disilane $Si_2H_6$, trichlorosilane $SiHCl_3$ or silicontetrachloride $SiCl_4$, or a compound of germanium such as germane $GeH_4$, germanium tetrachloride $GeCl_4$ or germanium tetraiodide $GeI_4$ commonly employed in known epitaxial growth processes. Any one of these starting materials is fed in its gaseous state into an epitaxial growth reactor while being entrained on a carrier gas such as hydrogen gas or argon gas. Since the epitaxial growth reactor is heated to a temperature above the decomposition temperature of the starting material, the compound is subject to thermal decomposition or hydrogen reduction and a silicon crystal is deposited therefrom. A doping material such as phosphine $PH_3$, arsine $AsH_3$, phosphorous trichloride $PCl_3$, boron trichloride $BCl_3$ or diborane $B_2H_6$ giving a predetermined impurity concentration may be mixed in its gaseous state with the above gas mixture for supply to the epitaxial growth reactor so that the doping material is also subject to thermal decomposition or hydrogen reduction and the doping material can be deposited therefrom. When the starting material is $SiH_4$ or $Si_2H_6$, a decomposition temperature of 900° C. to 1200° C., especially 950° C. to 1050° C. is preferred. When the starting material is $SiHCl_3$ or $SiCl_4$, a decomposition temperature of 1100° C., to 1350° C., especially 1100° C. to 1200° C., is preferred. The temperature, duration, concentration (MR) of starting material, and feeding rate for the epitaxial growth must properly be selected since these conditions determine not only the growth rate of the epitaxial growth layer but also the degree of impurity concentration gradient across the PN junction.

Figure 5:
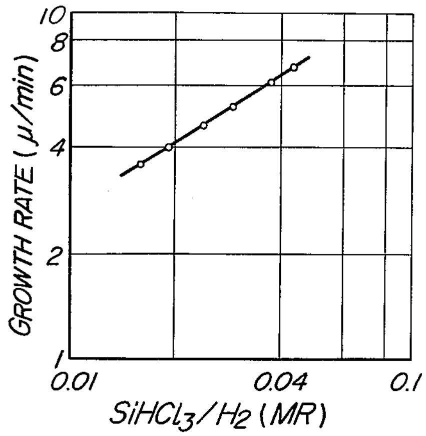
FIG. 5 is a graph showing a relationship between mole ratio (MR) of gas material and an epitaxial growth rate which is suitable for forming the high-doped region in the Zener diode of the present invention.

FIG. 5 shows a preferred growth rate in $\mu$/min. of the epitaxial growth layer when $SiHCl_3$ is employed as the starting material and is made to deposit at 1200° C. The inventors have discovered that the range shown in the graph of FIG. 5 is especially preferred for the formation of the high-doped region. While an increase in the mole ratio MR of $SiHCl_3$ to $H_2$ is advantageous for increasing the growth rate of silicon single crystals, an excessive increase in the mole ratio MR is undesirable because not only is $SiHCl_3$ not fully utilized resulting in a loss thereof, but also polycrystal or crystal imperfection tends to appear in the deposited layer. Accordingly, the growth rate should be less than 7 $\mu$/min. An excessively slow growth rate is objectionable because a lot of time is required for the formation of a high-doped region of desired thickness resulting in a reduction in production efficiency. More precisely, in such a case, the desired impurity atom concentration gradient across the PN junction cannot be obtained and the desired flatness of the plane of the junction is lost due to the impurity diffusion taking place during the period of epitaxial growth, resulting in the deterioration of Zener breakdown characteristics. It is therefore desirable that the growth rate be more than 3 $\mu$/min. as seen in FIG. 5. According to investigations by the inventors, it has been clarified that a growth rate of 3 to 7 $\mu$/min. is especially preferable.

Figure 1A:
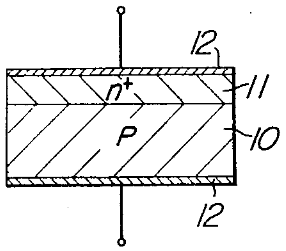

Referring to FIG. 1*a* showing schematically the structure of the Zener diode according to the present invention, the Zener diode comprises a low-doped substrate 10 of a P-type silicon crystal, a high-doped region 11 of N-type formed on the substrate 10 by epitaxial growth, and layers 12 of a metal conductor in ohmic contact with the opposite surfaces of the diode structure. The substrate 10 has an impurity concentration of $1\times10^{17}$ to $4\times10^{19}$ atoms/cm.$^3$ and the high-doped region 11 has an impurity concentration of $2\times10^{19}$ to $1\times10^{21}$ atoms/cm.$^3$ as described already. The metal conductor in ohmic contact with the diode structure is alloyed or soldered to the latter by vapor coating or plating. In the diode structure, the PN junction must have an impurity concentration gradient of the order of $2\times10^{21}$ to $7\times10^{23}$ atoms/cm.$^4$.

The high-doped region formed by means of the epitaxial growth must have a certain thickness so that the metal conductor can be deposited without adversely affecting the function of the PN junction. The PN junction may be short-circuited and does not show the Zener characteristics with a metal conductor such as aluminum or gold which alloys easily with silicon is alloyed to the high-doped region to such an extent that the alloyed region extends to the PN junction. When means other than alloying, such as plating of a metal, for example, nickel, is resorted to for the deposition of the metal conductor, a sand blasting treatment is commonly performed prior to plating in order to ensure a positive electrical-mechanical connection between the plated metal and the silicon body. In this case too, the Zener characteristics may be impaired if the internal strain due to the working extends to the PN junction. It is therefore required that the high-doped region have generally a thickness of more than 5 $\mu$, more especially a thickness of more than 10 $\mu$ although the requirement in regard to thickness varies depending on the method of treatment and the manner of deposition of the metal conductor. Especially in the case of the ohmic contact, the minimum required thickness of the high-doped region must be determined depending on the solubility of a specific metal with respect to the silicon crystal. A thickness of more than 10 $\mu$ and up to 50 $\mu$, especially in the range between 15 $\mu$ and 30 $\mu$, is preferred when the metal is aluminum and the semiconductor material is silicon. For example, an alloyed region about 4 $\mu$ thick is formed when an aluminum film 10 $\mu$ thick is evaporated on silicon and is then subjected to a standard heat-alloying process. This means that the high-doped region must be at least 5 $\mu$ thick.

After the metal conductor is evaporated, plated or otherwise deposited on the wafer having been subjected to the epitaxial growth process thereby completing the electrical connection therebetween, the wafer is punched out to obtain a pellet of a predetermined size and the exposed surface of the silicon crystal is then etched for the purpose of recovery of the characteristics. In such a case, the end portion of the pellet is side-etched with the result that the end edges of the conductor film may droop to contact the PN junction thereby giving rise to trouble such as short-circuiting. It is thus necessary from the above point to appropriately select the thickness of the high-doped region. However, there is a certain limit to the thickness of the high-doped region. Such a limitation results from the fact that thickening of the high-doped region requires a correspondingly longer period of epitaxial growth provided that the growth rate is fixed, and consequently such a long growth period gives rise to an undesirable deviation of the degree of impurity concentration gradient across the PN junction from the desired value. As a result, Zener diodes which have low Zener breakdown voltage characteristics can be produced. According to the experiment made by the inventors, Zener diodes having desired characteristics could be obtained at a yield rate of more than 60 percent when the thickness of the high-doped region ranges from 10 to 35 $\mu$ and at a yield rate of more than 95 percent when the thickness ranges from 20 to 30 $\mu$.

Figure 1B:
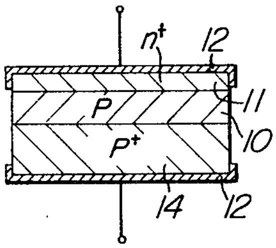
Figure 1C:
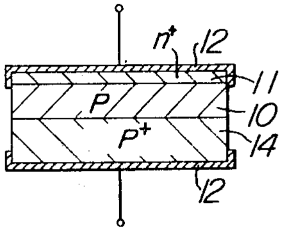
Figure 2:
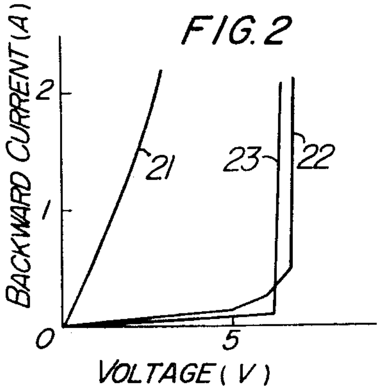

In FIG. 1*b* there is shown another form of the Zener diode according to the present invention which has a three-layer structure comprising a $P^+$-type region 14, a P-type region 10, and an $N^+$-type region 11. The $P^+$-type region 14 which has a thickness of 100–200 $\mu$ serves as a substrate for epitaxial growth and at the same time as a low resistance layer on which one of the metal conductors 12 is connected. The P-type region 10 is a low-doped region formed by epitaxial growth and has a thickness of 10 to 30 $\mu$. The $N^+$-type region 11 is a high-doped region which is formed on the P-type region 11 and contains an impurity which gives a conductivity type opposite to that of P-type. The $N^+$-type region 12 must have a thickness of more than 5 $\mu$, more especially more than 10 $\mu$ as described above, in order to prevent the alloyed region or the drooping end edge of an overlying metal conductor from contacting the PN junction thereby giving rise to short-circuiting. If the thickness of the $N^+$-type region 12 is less than 4 $\mu$, the alloyed region or the drooping end edge of the metal conductor would contact the PN junction as shown in FIG. 1*c* and a short circuit would result. Backward current-voltage characteristics of a Zener diode whose $N^+$-type region has a thickness larger than 5 $\mu$ as shown in FIG. 1*b* were compared with similar characteristics of Zener diodes whose $N^+$-type region has a thickness smaller than 4 $\mu$. The results are as shown in FIG. 2, from which it will be seen that the latter diodes have quite unsatisfactory Zener breakdown characteristics as represented by the curves 21 and 22, while the former diode shows sharp Zener breakdown characteristics as represented by the curve 23. A microscopic examination on the portion including the PN junction and the overlying metal conductor proved that the end edge of the conductor film drooped to contact the PN junction as seen in FIG. 1*c*. However, in the case of the $N^+$-type region having a thickness larger than 5 $\mu$, the drooping end portion of the metal conductor did not extend to the PN junction as seen in FIG. 1*b*.

The method employed for the manufacture of the Zener diode according to the present invention as well as its operating characteristics will be described in detail hereunder.

Figure 4:
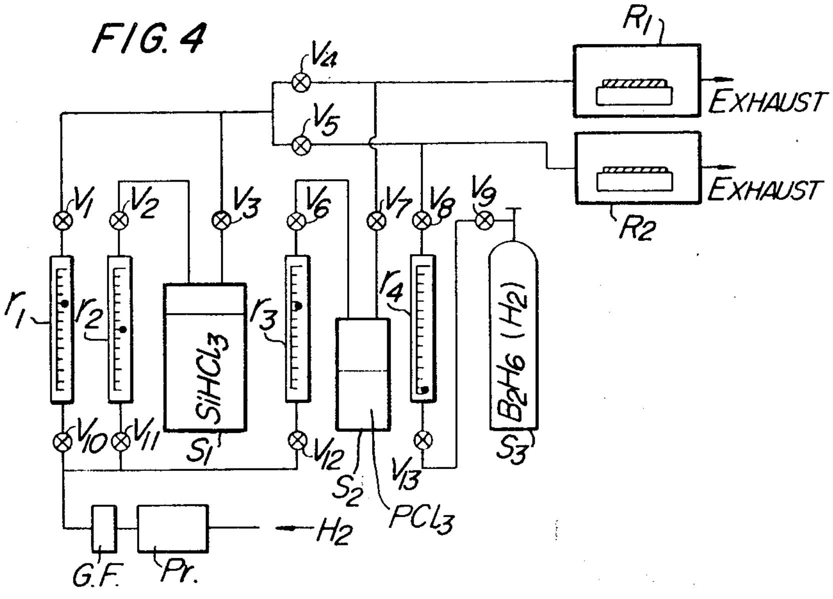
FIG. 4 is a schematic diagram of an apparatus preferably used for the manufacture of the Zener diode of the present invention.

FIG. 4 is a schematic diagram of an epitaxial growth apparatus employed in making the Zener diode embodying the present invention. At first, $SiHCl_3$, $PCl_3$ and $B_2H_6$ (including $H_2$ gas) are charged in a starting material storage tank $S_1$, an N-type dopant compound storage tank $S_2$ and a P-type doping material storage tank $S_3$, respectively. Valves $V_1$, $V_4$, $V_5$ and $V_{10}$ are opened and pure $H_2$ gas (with a dew point below about –70° C.) is fed through a gas purifier $P_r$ and a gas line filter GF into a flow meter $r_1$ and epitaxial growth reactors $R_1$ and $R_2$ to clean the interior of the same. Then, a silicon single crystal wafer serving as a substrate is placed on a heating zig disposed within the reactor $R_1$, and a predetermined amount of $SiHCl_3$ suitably diluted with $H_2$ gas and kept at a desired temperature, for example, at 2° C.±1° C. is supplied from the tank $S_1$ into the reactor $R_1$ by way of the gas line. Since the reactor $R_1$ is heated to a temperature above the decomposition temperature of the starting material $SiHCl_3$, decomposition of the starting material and epitaxial growth of silicon take place in the reactor $R_1$. During this treatment, the tanks $S_1$ and $S_3$ are connected solely with the reactor $R_1$ in the gas line. In the reactor $R_1$, a P-type epitaxial growth layer containing a predetermined amount of impurity is formed on the substrate. In the present embodiment of the invention, the dopant compound $B_2H_6$ was supplied into the $SiHCl_3$-$H_2$ gas mixture in an amount of $10_{+}^{2}$ )/min. and at a flow rate of $1\times10^3$ to $3\times10^3$ cm./min. The flow rate and the concentration of $SiHCl_3$ into the reactor $R_1$ are determined by the amount of supply of $H_2$ gas and the temperature of storage tank $S_1$ since $SiHCl_3$ is evaporated by the $H_2$ gas fed into the tank $S_1$. The concentration of $SiHCl_3$ to be supplied must be accurately controlled since it governs the growth rate of the epitaxial layer. While the growth rate varies depending on the size of the reactor $R_1$ and on the reaction temperature or temperature of epitaxial growth, an amount of $H_2$ gas of 40 to 70 liters per minute is preferred when the diameter of the reactor $R_1$ is 100 mm.

After the P-type region or low-doped region having the desired thickness and impurity concentration has been formed on the substrate, the semiconductor structure is transferred from the reactor $R_1$ to the N-type reactor $R_2$ for performing the epitaxial growth of an N-type layer by employing the gas line including the tanks $S_1$ and $S_2$ and the reactor $R_2$. $SiHCl_3$ and $PCl_3$ are mixed at a fixed ratio and epitaxial growth is effected as in the case of the treatment with the reactor $R_1$. The amount of $PCl_3$ to be supplied is dependent upon the amount of $H_2$ gas. For example, an $N^+$-type layer containing a dopant (impurity) in the order of $10^{20}$ atoms/cm.$^3$ can be obtained when the $H_2$ gas is supplied at a rate of 7 to 20 $l$/min.

FIGS. 8*a* and 8*b* are graphs showing the relation between the impurity concentration of the P-type region or low-doped region and the Zener breakdown voltage when the P-type region and the $N^+$-type region in the Zener diode having the $N^+PP^+$ structure are formed by the epitaxial growth process. More precisely, the graphs show the impurity concentration relative to the required Zener breakdown voltage in order to obtain such a Zener breakdown voltage while maintaining the desired impurity concentration gradient across the PN junction. It is clear from these graphs what the optimum impurity concentration of the low-doped region is in order to obtain a Zener diode having a Zener breakdown voltage of, for example, 7 volts.

FIG. 8*a* shows the results obtained when $SiHCl_3$ and $SiCl_4$ are employed as the starting compound, while FIG. 8*b* shows the results obtained when $SiH_4$ is employed as the starting material. The curves A and E in FIGS. 8*a* and 8*b* are taken from the report of S. L. Miller appearing in Physical Review 1957, 105, pp. 1246–1249 and represent the relation between the impurity concentration of a low-doped region in a PN junction and the Zener breakdown voltage of a Zener diode made by the alloying method. From these curves it will be seen that the low-doped region must have an impurity concentration of $4\times10^{17}$ atoms/cm.$^3$ in order that the Zener diode has a Zener breakdown voltage of 7 volts. While it is possible to make a diode having a small PN junction area by the alloying of aluminum, it is not possible to make a diode having such a large current capacity that its Zener breakdown current or Zener breakdown initiation current is, for example, more than 10 watts of rating wattage. Such a defect encountered with the Zener diode made by the alloying method can be eliminated in accordance with the present invention. That is, the prior defect can be overcome by setting the impurity concentration of the low-doped region of the Zener diode so as to lie within the hatched range in FIGS. 8*a* and 8*b*.

The curves C, D and B in FIG. 8*a* are approximately represented by the following equations, respectively:

C ... $\log V_Z=(-0.09x^2+0.26x+0.94)^{11}$ (1)

D ... $\log V_Z=(-0.09x^2+0.29x+1.06)^{11}$ (2)

B ... $\log V_Z=(-0.09x^2+0.32x+1.21)^{11}$ (3)

where $V_Z$ is the Zener breakdown voltage, $x=\log(N/2\times10^{18})$, and $N$ is the impurity concentration in atoms/cm.$^3$.

As described in the above, the impurity concentration of the low-doped region of the Zener diode according to the present invention is set to lie within the hatched range shown in FIGS. 8*a* and 8*b*. In this connection, it is recommended to employ the equation (2) as the standard in order to obtain Zener diodes having the desired Zener characteristics at a high yield rate.

The values of points A to L and A′ to L′ plotted in the graph of FIG. 8*a* are as follows:

| Plotted points | $V_z$ (volts) | Impurity concentration (atoms/cm.$^3$) |
|---|---|---|
| A | 37 | $2.0\times10^{17}$ |
| B | 25 | $4.0\times10^{17}$ |
| C | 20 | $6.0\times10^{17}$ |
| D | 17 | $8.0\times10^{17}$ |
| E | 15.5 | $1.0\times10^{18}$ |
| F | 12 | $2.0\times10^{18}$ |
| G | 10 | $4.0\times10^{18}$ |
| H | 9.3 | $6.0\times10^{18}$ |
| I | 9.0 | $8.0\times10^{18}$ |
| J | 8.7 | $1.0\times10^{19}$ |
| K | 8.0 | $2.0\times10^{19}$ |
| L | 7.8 | $4.0\times10^{19}$ |
| A′ | 17 | $2.0\times10^{17}$ |
| B′ | 12 | $4.0\times10^{17}$ |
| C′ | 10 | $6.0\times10^{17}$ |
| D′ | 8.8 | $8.0\times10^{17}$ |
| E′ | 8.2 | $1.0\times10^{18}$ |
| F′ | 6.8 | $2.0\times10^{18}$ |
| G′ | 6.0 | $4.0\times10^{18}$ |
| H′ | 5.6 | $6.0\times10^{18}$ |
| I′ | 5.5 | $8.0\times10^{18}$ |
| J′ | 5.4 | $1.0\times10^{19}$ |
| K′ | 5.1 | $2.0\times10^{19}$ |
| L′ | 5.0 | $4.0\times10^{19}$ |

The plotted points A to L are approximately given by the equation (1), and the plotted points A′ to L′ are approximately given by the equation (3).

Plotted points *a* to *v* in FIG. 8*a* represent the relation between the impurity concentration of the low-doped region and the Zener breakdown voltage of the Zener diode according to the present invention.

| Plotted points | $V_z$ (volts) | Impurity concentration (atoms/cm.$^3$) |
|---|---|---|
| *a* | 27 | $2.1\times10^{17}$ |
| *b* | 20 | $2.3\times10^{17}$ |
| *c* | 19 | $3.0\times10^{17}$ |
| *d* | 17 | $3.2\times10^{17}$ |
| *e* | 18 | $4.1\times10^{17}$ |
| *f* | 15.5 | $4.7\times10^{17}$ |
| *g* | 14 | $7.8\times10^{17}$ |
| *h* | 13.5 | $7.6\times10^{17}$ |
| *i* | 12 | $8.8\times10^{17}$ |
| *j* | 12 | $1.12\times10^{18}$ |
| *k* | 10.5 | $1.16\times10^{18}$ |
| *l* | 9.2 | $1.28\times10^{18}$ |
| *m* | 8.0 | $2.0\times10^{18}$ |
| *n* | 7.2 | $3.0\times10^{18}$ |
| *o* | 7.8 | $3.3\times10^{18}$ |
| *p* | 7.7 | $5.9\times10^{18}$ |
| *q* | 6.6 | $6.9\times10^{18}$ |
| *r* | 6.6 | $8.6\times10^{18}$ |
| *s* | 7.0 | $1.09\times10^{19}$ |
| *t* | 6.7 | $1.4\times10^{19}$ |
| *u* | 6.2 | $2.0\times10^{19}$ |
| *v* | 6.2 | $3.1\times10^{19}$ |

The curves F, G and H in FIG. 8*b* are approximately represented by the following equations, respectively:

*G*...$\log V_Z=(-0.075x^2+0.52x+1.59)^{11}$ (4)

*H*...$\log V_Z=(-0.075x^2+0.31x+1.17)^{11}$ (5)

*F*...$\log V_Z=(-0.075x^2+0.38x+1.36)^{11}$ (6)

In this case too, Zener diodes having the desired Zener characteristics can be obtained at a high yield rate when the Zener breakdown voltage and the impurity concentration of the low-doped region are selected in accordance with equation (5). Plotted points A to L in FIG. 8*b* are approximately given by the equation (4), while plotted points A′ to L′ are approximately given by equation (6). Plotted points *a* to 1 represent the relation between the impurity concentration of the low-doped region and the Zener breakdown voltage of the Zener diode actually manufactured.

The practical values of these points are as follows:

| Plotted points | $V_z$ (volts) | Impurity concentration (atoms/cm.$^3$) |
|---|---|---|
| A | 28.2 | $2.0\times10^{17}$ |
| B | 19.0 | $4.0\times10^{17}$ |
| C | 15.7 | $6.0\times10^{17}$ |
| D | 13.8 | $8.0\times10^{17}$ |
| E | 12.7 | $1.0\times10^{18}$ |
| F | 9.9 | $2.0\times10^{18}$ |
| G | 8.4 | $4.0\times10^{18}$ |
| H | 7.9 | $6.0\times10^{18}$ |
| I | 7.6 | $8.0\times10^{18}$ |
| J | 7.4 | $1.0\times10^{19}$ |
| K | 6.9 | $2.0\times10^{19}$ |
| L | 6.7 | $4.0\times10^{19}$ |
| A' | 12.8 | $2.0\times10^{17}$ |
| B' | 8.7 | $4.0\times10^{17}$ |
| C' | 7.4 | $6.0\times10^{17}$ |
| D' | 6.7 | $8.0\times10^{17}$ |
| E' | 6.3 | $1.0\times10^{18}$ |
| F' | 5.3 | $2.0\times10^{18}$ |
| G' | 4.8 | $4.0\times10^{18}$ |
| H' | 4.6 | $6.0\times10^{18}$ |
| I' | 4.55 | $8.0\times10^{18}$ |
| J' | 4.5 | $1.0\times10^{19}$ |
| K' | 4.3 | $2.0\times10^{19}$ |
| L' | 4.2 | $4.0\times10^{19}$ |
| *a* | 16.2 | $2.15\times10^{17}$ |
| *b* | 12.5 | $2.95\times10^{17}$ |
| *c* | 13.1 | $4.0\times10^{17}$ |
| *d* | 10.0 | $6.0\times10^{17}$ |
| *e* | 8.1 | $1.0\times10^{18}$ |
| *f* | 6.6 | $1.95\times10^{18}$ |
| *g* | 6.4 | $3.0\times10^{18}$ |
| *h* | 5.6 | $6.0\times10^{18}$ |
| *i* | 5.1 | $1.0\times10^{19}$ |
| *j* | 5,8 | $1.12\times10^{19}$ |
| *k* | 4.9 | $2.0\times10^{19}$ |
| *l* | 4.9 | $4.0\times10^{19}$ |

5.8

FIG. 9*a* shows the frequency of Zener breakdown initiation currents or current values at which the breakdown occurs in Zener diodes made according to the present invention, while FIG. 9*b* shows a similar frequency in conventional Zener diodes made by the diffusion method. Thirty PN junctions made by epitaxial growth and 30 PN junctions made by diffusion were placed under test to observe the Zener breakdown initiation current. It will be seen from FIGS. 9*a* and 9*b* that the mean value of Zener breakdown initiation currents in the Zener diodes of the present invention is one-tenth or less than that of the conventional diodes made by the diffusion method. Such an excellent feature results from the fact that the interface state of the PN junction in the Zener diode according to the present invention is quite uniform and the width of the space charge layer is small as described with reference to FIG. 6 and there is an abrupt change in impurity concentration across the junction. Thirty Zener diodes made according to the present invention were compared with 30 Zener diodes made by the diffusion method to seek their dynamic impedance distribution. The results are as shown in FIG. 10, from which it will be seen that the dynamic impedance of the Zener diode according to the present invention is very low or less than about one-third that of the conventional diode made by the diffusion method. The mean value of dynamic impedances measured on the 30 diodes of the present invention is 0.081 ohms in contrast to 0.24 ohms in the case of those made by the diffusion method. This is because the plane of the PN junction in the diode of the present invention is flat, and the width of the space charge layer is small as described with reference to FIG. 6.

What is claimed is:

1. A Zener diode comprising a first layer of a single crystalline silicon doped with an impurity which gives one conductivity type thereto, a second layer formed on a flat and smooth surface of said first layer by means of gas-phase epitaxial growth of silicon and doped with an impurity which gives a conductivity type opposite to that of said first layer, and metal conductors provided on said first and second layers respectively, wherein said first layer and said second layer have an impurity concentration of from $1\times10^{17}$ to $4\times10^{19}$ atoms/cm.$^3$ and an impurity concentration of from $1\times10^{19}$ to $1\times10^{21}$ atoms/cm.$^3$, respectively, and there is an impurity concentration gradient of from $2\times10^{21}$ to $7\times10^{23}$ atoms/cm.$^4$ across the PN junction between said layers.

2. A Zener diode according to claim 1, wherein said second layer is a high-doped region which has such a thickness that the PN junction is prevented from being physically as well as electrically affected by a conductor electrode which is deposited later on said second layer.

3. A Zener diode according to claim 2, wherein said second layer contacts with its flat and smooth surface with said first layer which is a low-doped region, and said second layer has a thickness of from 5 to 35 microns.

4. A Zener diode according to claim 1, wherein said first layer is formed by means of gas-phase epitaxial growth of silicon.

5. A Zener diode according to claim 4, wherein the impurity concentration gradient at and in the vicinity of the PN junction formed by said first and second layers is approximately in the range of from $z\times10^{21}$ to $7\times10^{23}$ atoms/cm.$^4$ and the region including said PN junction.

6. A Zener diode according to claim 4, wherein a low resistance layer is further provided on the side of said first layer where said metal conductor is to be provided.

7. A Zener diode according to claim 1, wherein said second layer has a thickness of 10 to 35 microns.

8. A Zener diode according to claim 1, wherein said second layer has a thickness of 20 to 30 microns.

9. A Zener diode comprising a silicon body including a low-doped region containing a P-type impurity in an impurity concentration of from $1\times10^{17}$ to $4\times10^{19}$ atoms/cm.$^3$, and a high-doped region containing an N-type impurity in an impurity concentration of from $1\times10^{19}$ to $1\times10^{21}$ atoms/cm.$^3$, wherein at least said high-doped region is formed by means of gas-phase epitaxial growth of silicon, the PN junction formed at the interface of said two regions has an impurity concentration gradient of from $2\times10^{21}$ to $7\times10^{23}$ atoms/cm.$^4$, and a metal conductor is electrically connected to each of the said two regions.

10. A Zener diode according to claim 9, wherein said metal conductor is a film of aluminum alloyed to said regions for ohmic contact therewith.

11. A Zener diode according to claim 9, wherein the metal conductors consist of nickel-gold provided by means of plating.

12. A Zener diode according to claim 9, wherein said low-doped region is formed by means of gas-phase epitaxial growth of silicon, and the relation between its impurity concentration N and Zener breakdown voltage $V_Z$ is given by $$\log V_Z=(-0.09\,x^2+0.29\,x+1.06)_+{}^1$$

where $$x=\log (N/\,2\times10^{18}).$$

13. A Zener diode according to claim 9, wherein said low-doped region is formed by means of gas-phase epitaxial growth of silicon, and the relation between its impurity concentration N and Zener breakdown voltage is given by $$\log V_Z=(0.075\,x\times^2+0.38\,x+1.36^{11}$$

where $$x=\log (N/2\times10^{18}).$$

14. A method of making Zener diodes comprising the steps of: smoothing and cleaning a surface of a single crystalline silicon wafer having a predetermined conductivity type and an impurity concentration of from $1\times10^{17}$ to $4\times10^{19}$ atoms/cm.$^3$, positioning said wafer within an epitaxial growth reactor provided with heating means and having been cleaned with a carrier gas, introducing into said reactor a starting material and a dopant material for giving a conductivity type opposite to that of said wafer together with a carrier gas, and effecting heat treatment in said reactor at a temperature higher than the decomposition temperature of said starting material so as to precipitate single crystals of silicon at a growth rate of from 3 to 7 microns/min. on said wafer due to decomposition, whereby between said wafer and the layer of said precipitated silicon there is formed a PN junction having an impurity concentration gradient approximately in the range of from $2\times10^{21}$ to $7\times10^{22}$ atoms/mc.$^4$.

15. A method of making Zener diodes according to claim 14, wherein said starting material is $SiH_4$.

16. A method of making Zener diodes according to claim 14, wherein said starting material is selected from the group consisting of $SiHCl_3$ and $SiCl_4$.

17. A method of making Zener diodes according to claim 15, wherein said heat treatment is effected at a temperature of from 850° to 1100° C.

18. A method of making Zener diodes according to claim 16, wherein said heat treatment is effected at 1050°temperature of from 10° to 1350° C.

19. A method of making Zener diodes according to claim 14, wherein the mole ratio of said starting material to said carrier gas is approximately in the range of from 0.02 to 0.05.

UNITED STATES PATENT OFFICE
CERTIFICATE OF CORRECTION

Patent No. 3,602,778 Dated August 31, 1971

Inventor(s) Mitsuru Ura and Takuzo Ogawa

It is certified that error appears in the above-identified patent and that said Letters Patent are hereby corrected as shown below:

Column 6, line 70, which now reads:

"in an amount of $10+^{2})$/min. and at a flow rate of $1 \times 10^{3}$ to 3x"

should read as follows:

-- in an amount of $10^{-2}$ 1/min. and at a flow rate of $1 \times 10^{3}$ to 3 x --

Column 7, line 60, which now reads:

"C...log $V_z=(-0.09\ x^2+0.26\ x+0.94)^{11}$ (1)"

should read as follows:

--C...log $V_z=(-0.09\ x^2+0.26\ x+0.94)^{-1}$ (1)--

Column 7, line 61, which now reads:

"D...log $V_z=(-0.09\ x^2+0.29\ x+1.06)^{-1}$ (2)"

should read as follows:

--D...log $V_z=(-0.09\ x^2+0.29\ x+0.06)^{-1}$ (2)--

UNITED STATES PATENT OFFICE
CERTIFICATE OF CORRECTION

Patent No. 3,602,778 Dated August 31, 1971

Inventor(s) Mitsuru Ura and Takuzo Ogawa

It is certified that error appears in the above-identified patent and that said Letters Patent are hereby corrected as shown below:

Column 7, line 62, which now reads:

"B... $\log V_Z=(-0.09\ x^2+0.32\ x+1.21)^{11}$ (3)"

should read as follows:

--B... $\log V_Z=(-0.09\ x^2+0.32\ x+1.21)^{-1}$ (3)--

Column 7, Line 63, which now reads:

"where $V_Z$ is the Zener breakdown voltage, $x=\log (N/2x10^{18})$,"

should read as follows:

--where $V_Z$ is the Zener breakdown voltage, $x=\log (N/2 \times 10^{-18})$ --

Column 8, line 62, which now reads:

"G... $\log V_Z=(-0.075\ x^2+0.52x+1.59)^{11}$ (4)"

should read as follows:

--G... $\log V_Z=(-0.075x^2+0.52x+1.59)^{-1}$ (4) --

UNITED STATES PATENT OFFICE
CERTIFICATE OF CORRECTION

Patent No. 3,602,778 Dated August 31, 1971

Inventor(s) Mitsuru Ura and Tokuzo Ogawa - 3 -

It is certified that error appears in the above-identified patent and that said Letters Patent are hereby corrected as shown below:

Column 8, line 63, which now reads:

"H...log $V_z=(-0.075x^2+0.31x+1.17)^{11}$ (5)"

should read as follows:

--H...log $V_z=(-0.075x^2+0.31x+1.17)^{-1}$ (5) --

Column 8, line 64, which now reads:

"F...log $V_z=(-0.075x^2+0.38x+1.36)^{11}$ (6)"

should read as follows:

--F...log $V_z=(-0.075x^2+0.38x+1.36)^{-1}$ (6)--

Column 9, line 10, which now reads:

"H 7.9 $6.0x10^{1'}$"

should read as follows:

--H 7.9 $6.0x10^{18}$--

UNITED STATES PATENT OFFICE
CERTIFICATE OF CORRECTION

Patent No. 3,602,778 Dated August 31, 1971

Inventor(s) Mitsuru Ura and Tokuzo Ogawa

It is certified that error appears in the above-identified patent and that said Letters Patent are hereby corrected as shown below:

Column 9, line 11, which now reads:

"I 7.6 8.0x10" "

should read as follows:

--I 7.6 $8.0x10^{18}$--

Column 10, line 20, which now reads:

"the range of from $zx10^{21}$ to $7x10^{23}$ atoms/$cm^4$ and the region"

should read as follows:

--the range of from $2x10^{21}$ to $7x10^{23}$ atoms/$cm^4$ and the region--

Column 10, line 50, which now reads:

"$\log V_z = (-0.09 x^2 + 0.29 x + 1.06)^{+1}$"

should read as follows:

--$\log V_z = (-0.09 x^2 + 0.29 x + 1.06)^{-1}$--

UNITED STATES PATENT OFFICE
CERTIFICATE OF CORRECTION

Patent No. 3,602,778 Dated August 31, 1971

Inventor(s) Mitsuru Ura and Tokuzo Ogawa - 5 -

It is certified that error appears in the above-identified patent and that said Letters Patent are hereby corrected as shown below:

Column 10, line 52, which now reads:

"$x=\log (N/2x10^{18})$"

should read as follows:

--$x=\log (N/2x10^{-18})$--

Column 10, line 57, which now reads:

"$\log V_z=(0.075\ xX^2+0.38\ x+1.36^{11}$"

should read as follows:

--$\log V_z=(0.075x^2 +0.38x+1.36)^{-1}$--

Column 10, line 60, which now reads:

"$x=\log (N/2x10^{18})$"

should read as follows:

--$x=\log (N/2x10^{-18})$--

Signed and sealed this 20th day of February 1973.

(SEAL)
Attest:

EDWARD M. FLETCHER, JR.
Attesting Officer

ROBERT GOTTSCHALK
Commissioner of Patents